(12) United States Patent
Cui et al.

(10) Patent No.: US 12,300,501 B2
(45) Date of Patent: May 13, 2025

(54) SYSTEMS AND METHODS FOR SELECTIVE METAL COMPOUND REMOVAL

(71) Applicant: Applied Materials, Inc., Santa Clara, CA (US)

(72) Inventors: Zhenjiang Cui, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 383 days.

(21) Appl. No.: 17/863,880

(22) Filed: Jul. 13, 2022

(65) Prior Publication Data

US 2022/0351979 A1 Nov. 3, 2022

Related U.S. Application Data

(63) Continuation of application No. 17/018,206, filed on Sep. 11, 2020, now Pat. No. 11,769,671.

(51) Int. Cl.
*H01L 21/3065* (2006.01)
*C23F 1/12* (2006.01)

(52) U.S. Cl.
CPC .......... *H01L 21/3065* (2013.01); *C23F 1/12* (2013.01)

(58) Field of Classification Search
None
See application file for complete search history.

(56) References Cited

U.S. PATENT DOCUMENTS

| 7,084,070 B1 * | 8/2006 | Lee .................. H01L 21/31111 257/E21.252 |
| 9,275,834 B1 | 3/2016 | Park et al. |
| 11,769,671 B2 | 9/2023 | Cui et al. |

(Continued)

FOREIGN PATENT DOCUMENTS

| JP | 10163127 A | 6/1998 |
| JP | 2006060167 A | 3/2006 |

(Continued)

OTHER PUBLICATIONS

Application No. PCT/US2021/049320, International Search Report and Written Opinion, Mailed On Dec. 28, 2021, 11 pages.

(Continued)

*Primary Examiner* — Allan W. Olsen
(74) *Attorney, Agent, or Firm* — Kilpatrick Townsend & Stockton LLP

(57) ABSTRACT

Exemplary etching methods may include flowing a fluorine-containing precursor and a hydrogen-containing precursor into a remote plasma region of a semiconductor processing chamber. The methods may include forming a plasma of the fluorine-containing precursor and the hydrogen-containing precursor to produce plasma effluents. The methods may include flowing the plasma effluents into a substrate processing region housing a substrate. The substrate may include an exposed region of a tantalum or titanium material and an exposed region of a silicon-containing material. The methods may include contacting the substrate with the plasma effluents. The methods may include removing the tantalum or titanium material selectively to the silicon-containing material. The tantalum or titanium material may be removed at a rate of at least 20:1 relative to the silicon-containing material.

20 Claims, 5 Drawing Sheets

(56) References Cited

U.S. PATENT DOCUMENTS

| | | |
|---|---|---|
| 2005/0215445 A1 | 9/2005 | Boumerzoug et al. |
| 2007/0128876 A1* | 6/2007 | Fukiage .............. C23C 16/4405 257/E21.226 |
| 2010/0059476 A1* | 3/2010 | Yamamoto ............. G11B 5/855 216/22 |
| 2013/0089988 A1 | 4/2013 | Wang et al. |
| 2014/0166617 A1 | 6/2014 | Chen et al. |
| 2014/0179111 A1 | 6/2014 | Liu et al. |
| 2014/0199850 A1 | 7/2014 | Kim et al. |
| 2014/0256131 A1 | 9/2014 | Wang et al. |
| 2014/0308816 A1 | 10/2014 | Wang et al. |
| 2015/0206764 A1 | 7/2015 | Wang et al. |
| 2015/0318186 A1 | 11/2015 | Zhang et al. |
| 2016/0086815 A1 | 3/2016 | Pandit et al. |
| 2018/0358220 A1 | 12/2018 | Yu et al. |
| 2019/0013211 A1* | 1/2019 | Wang ............... H01J 37/32357 |
| 2019/0198300 A1 | 6/2019 | Zhang et al. |
| 2020/0118829 A1 | 4/2020 | Cui et al. |
| 2020/0135491 A1 | 4/2020 | Cui et al. |
| 2021/0305071 A1* | 9/2021 | Wang ................ H01L 21/67069 |

FOREIGN PATENT DOCUMENTS

| | | | |
|---|---|---|---|
| JP | 2009509337 A | 3/2009 | |
| JP | 2012243958 A | 12/2012 | |
| JP | 2014103155 A | 6/2014 | |
| JP | 2018041886 A | 3/2018 | |
| TW | 201430944 A | 8/2014 | |
| WO | WO-2010115734 A1 * | 10/2010 | ......... C23C 16/4405 |
| WO | 2020086288 A1 | 4/2020 | |

OTHER PUBLICATIONS

Application No. PCT/US2021/049320, International Preliminary Report on Patentability, Mailed On Mar. 23, 2023, 7 pages.

* cited by examiner

SYSTEMS AND METHODS FOR SELECTIVE METAL COMPOUND REMOVAL

CROSS-REFERENCE TO RELATED APPLICATIONS

This application is a continuation of U.S. application Ser. No. 17/018,206, filed Sep. 11, 2020, which is hereby incorporated by reference in its entirety for all purposes.

TECHNICAL FIELD

The present technology relates to semiconductor processes and equipment. More specifically, the present technology relates to selectively etching metal-containing structures relative to other materials.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing a fluorine-containing precursor and a hydrogen-containing precursor into a remote plasma region of a semiconductor processing chamber. The hydrogen-containing precursor may be flowed at a flow rate of at least 2:1 relative to the flow rate of the fluorine-containing precursor. The methods may include forming a plasma of the fluorine-containing precursor and the hydrogen-containing precursor to produce plasma effluents. The methods may include flowing the plasma effluents into a substrate processing region housing a substrate. The substrate may include an exposed region of a tantalum or titanium material and an exposed region of a silicon-containing material or a metal. The methods may include contacting the substrate with the plasma effluents. The methods may include removing the tantalum or titanium material selectively to the silicon-containing material or the metal.

In some embodiments, the tantalum or titanium material may be or include tantalum or titanium metal or an oxide or nitride of tantalum or titanium. The metal may be tungsten, cobalt, or copper. A plasma power may be maintained at less than or about 1,000 W. The etching method may be performed at a temperature greater than or about 150° C. The etching method may be performed at a pressure less than or about 10 Torr. The methods may include a pre-treatment performed prior to flowing the fluorine-containing precursor. The pre-treatment may include contacting the substrate with a plasma comprising one or more of oxygen, hydrogen, water vapor, or nitrogen. The methods may include a post-treatment performed subsequent the etching method, wherein the post-treatment comprises contacting the substrate with a plasma comprising one or more of hydrogen, nitrogen, oxygen, or water vapor. The methods may include removing the substrate from the semiconductor processing chamber. The methods may include removing a residue from chamber walls of the semiconductor processing chamber. Removing the residue may include providing a chlorine-containing precursor or plasma effluent or a bromine-containing precursor or plasma effluent.

Some embodiments of the present technology may encompass etching methods. The methods may include forming a plasma of a treatment precursor including one or more of oxygen, hydrogen, or nitrogen to produce treatment plasma effluents. The methods may include flowing the treatment plasma effluents into a substrate processing region of a semiconductor processing chamber. The methods may include contacting a substrate housed in the substrate processing region with the treatment plasma effluents. The substrate may define an exposed region of a tantalum or titanium material and an exposed region of a tungsten, cobalt, or copper. The methods may include removing a carbon-containing material from a surface of the tantalum or titanium material. The methods may include forming a plasma of a fluorine-containing precursor and a hydrogen-containing precursor. The methods may include contacting the substrate with plasma effluents. The methods may include removing the tantalum or titanium material.

In some embodiments, the hydrogen-containing precursor may be flowed at a rate relative to the fluorine-containing precursor of greater than or about 2:1. A plasma power during the forming a plasma of the fluorine-containing precursor may be maintained at less than or about 1,000 W. The etching method may be performed at a temperature greater than or about 300° C. The etching method may be performed at a pressure less than or about 10 Torr. The methods may include a post-treatment performed subsequent the etching method. The post-treatment may include contacting the substrate with a plasma comprising hydrogen. The methods may include removing the substrate from the semiconductor processing chamber. The methods may include removing a residue from chamber walls of the semiconductor processing chamber.

Some embodiments of the present technology may encompass etching methods. The methods may include flowing a fluorine-containing precursor and a hydrogen-containing precursor into a remote plasma region of a semiconductor processing chamber. The hydrogen-containing precursor may be flowed at a flow rate of at least 2:1 relative to the flow rate of the fluorine-containing precursor. The methods may include forming a plasma of the fluorine-containing precursor and the hydrogen-containing precursor to produce plasma effluents. The methods may include flowing the plasma effluents into a substrate processing region housing a substrate. The substrate may include an exposed region of a tantalum or titanium material and an exposed region of a silicon-containing material or a metal. The methods may include contacting the substrate with the plasma effluents. The methods may include removing the tantalum or titanium material selectively to the silicon-containing material or the metal. The methods may include forming a plasma of a treatment precursor including hydrogen to produce treatment plasma effluents. The methods may include contacting the substrate with the treatment plasma effluents.

In some embodiments, the treatment plasma effluents may be configured to remove residual fluorine from one or more of the substrate or the semiconductor processing chamber. The methods may include removing the substrate from the semiconductor processing chamber. The methods may include removing a residue from chamber walls of the semiconductor processing chamber with a chlorine-containing precursor.

Such technology may provide numerous benefits over conventional systems and techniques. For example, the processes may allow dry etching to be performed that may protect features of the substrate. Additionally, the processes may selectively remove tantalum and titanium materials relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
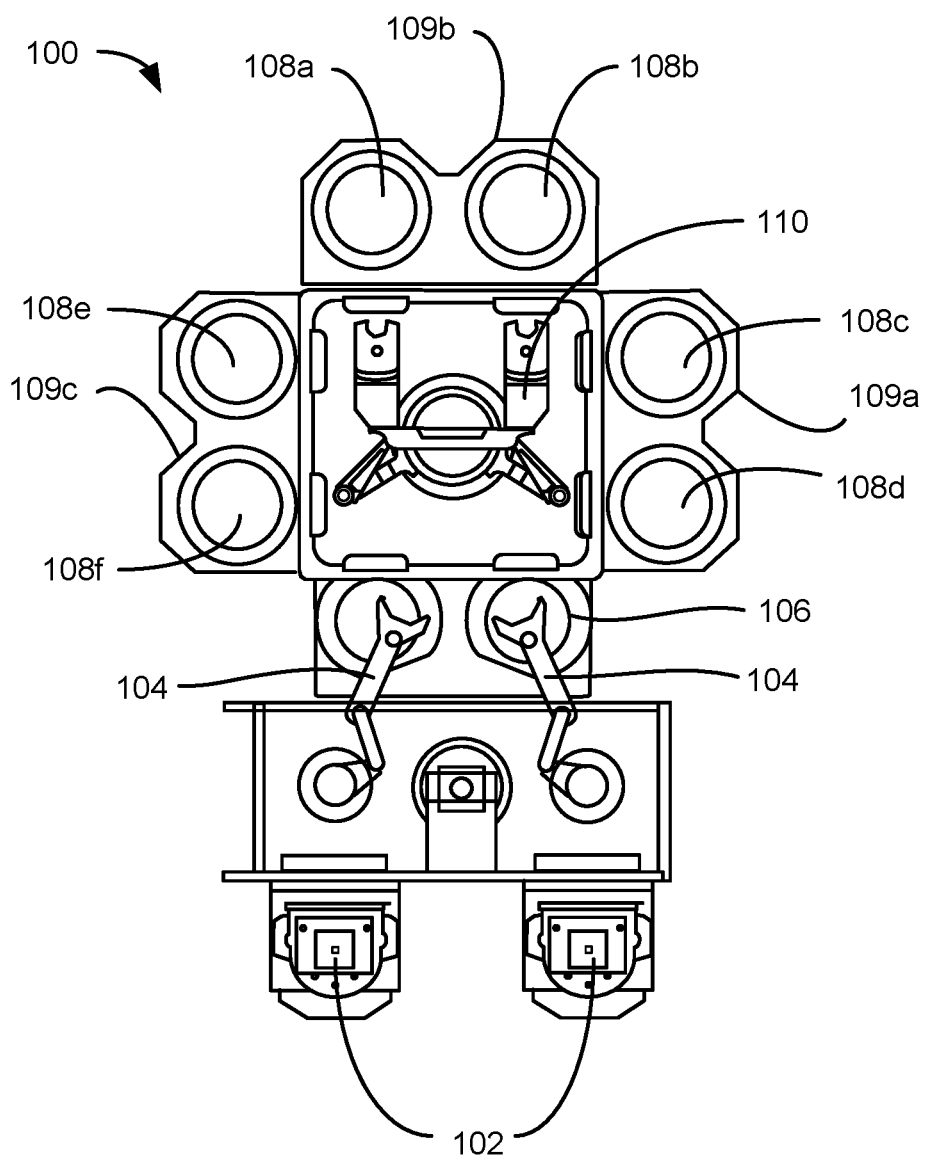
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Diluted acids may be used in many different semiconductor processes for cleaning substrates and removing materials from those substrates. For example, diluted hydrofluoric acid can be an effective etchant for silicon oxide, titanium oxide, and other materials, and may be used to remove these materials from substrate surfaces. After the etching or cleaning operation is complete, the acid may be dried from the wafer or substrate surface. Using dilute hydrofluoric acid ("DHF") may be termed a "wet" etch, and the diluent is often water. Additional etching processes may be used that utilize precursors delivered to the substrate. For example, plasma enhanced processes may also selectively etch materials by enhancing precursors through the plasma to perform a dry etch, including a reactive ion etching.

Although wet etchants using aqueous solutions or water-based processes may operate effectively for certain substrate structures, the water may pose challenges in a variety of conditions. For example, utilizing water during etch processes may cause issues when disposed on substrates including metal materials. For example, certain later fabrication processes, such as recessing gaps, removing oxide dielectric, or other processes to remove oxygen-containing materials, may be performed after an amount of metallization has been formed on a substrate. If water is utilized in some fashion during the etching, an electrolyte may be produced, which when contacting the metal material, may cause galvanic corrosion to occur between dissimilar metals, and the metal may be corroded or displaced in various processes. In addition, because of the surface tension of the water diluent, pattern deformation and collapse may occur with minute structures. The water-based material may also be incapable of penetrating some high aspect ratio features due to surface tension effects, and may reduce etch rates in small spaces due to an electrical double layer of ionic solution that may be formed, which may slow transport within the feature. This may extend exposure times, and affect etching relative to other materials.

Plasma etching may overcome the issues associated with water-based etching, although additional issues may occur. For example, a reactive ion etch process may expose the metal to ion activity, which through bombardment can damage the structure, and affect electrical characteristics. The present technology overcomes these issues by performing a dry etch process that may limit bombardment to surfaces, while performing a reaction that can facilitate removal of target materials. Additionally, the materials and conditions used may allow improved etching relative to conventional techniques.

Although the remaining disclosure will routinely identify specific etching processes utilizing the disclosed technology, it will be readily understood that the systems and methods are equally applicable to deposition and cleaning processes as may occur in the described chambers, as well as other etching technology including mid and back-end-of-line processing and other etching that may be performed with a variety of exposed materials that may be maintained or substantially maintained. Accordingly, the technology should not be considered to be so limited as for use with the exemplary etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
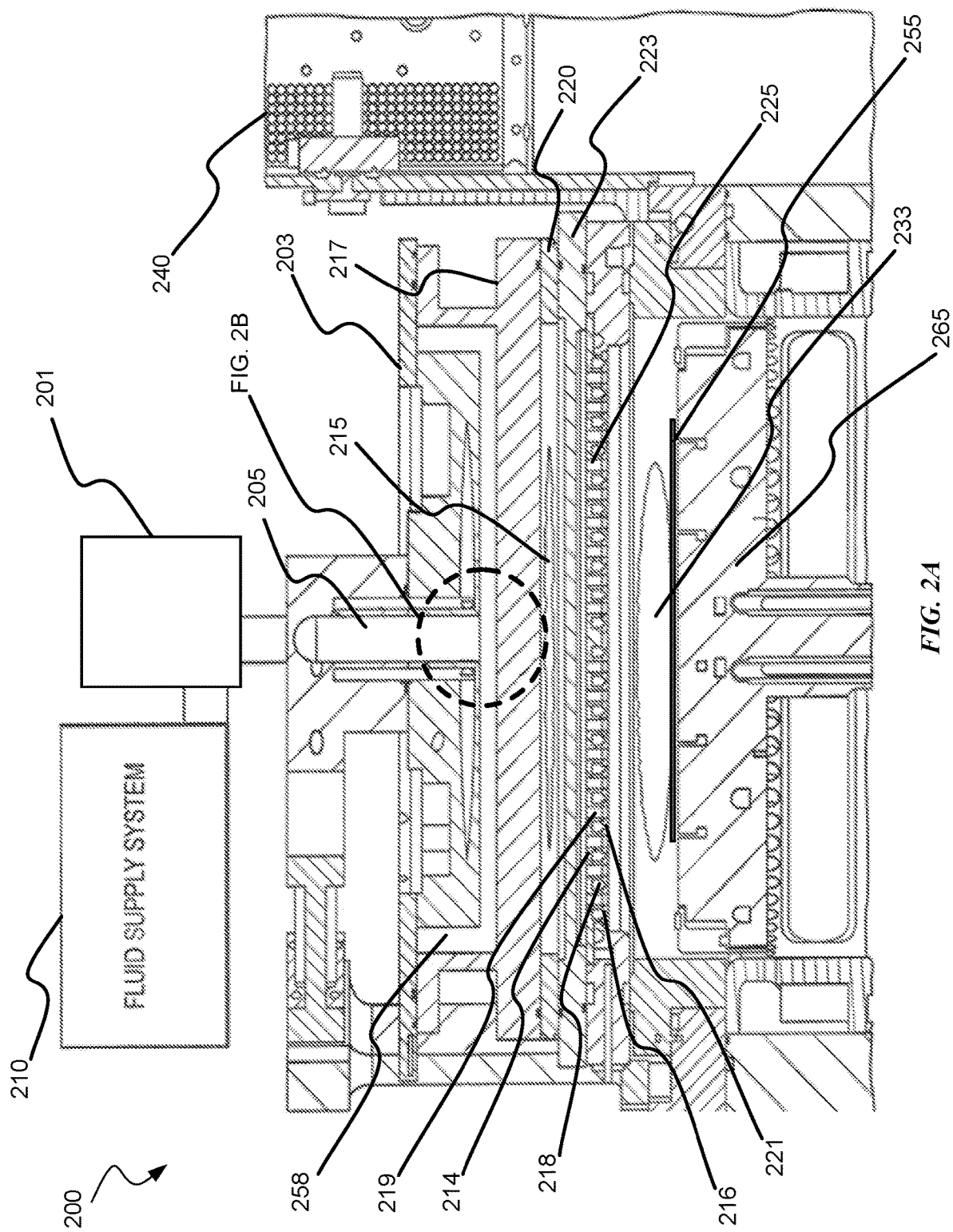
FIG. 2A shows a schematic cross-sectional view of an exemplary processing chamber according to some embodiments of the present technology.

FIG. 2A shows a cross-sectional view of an exemplary processing system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
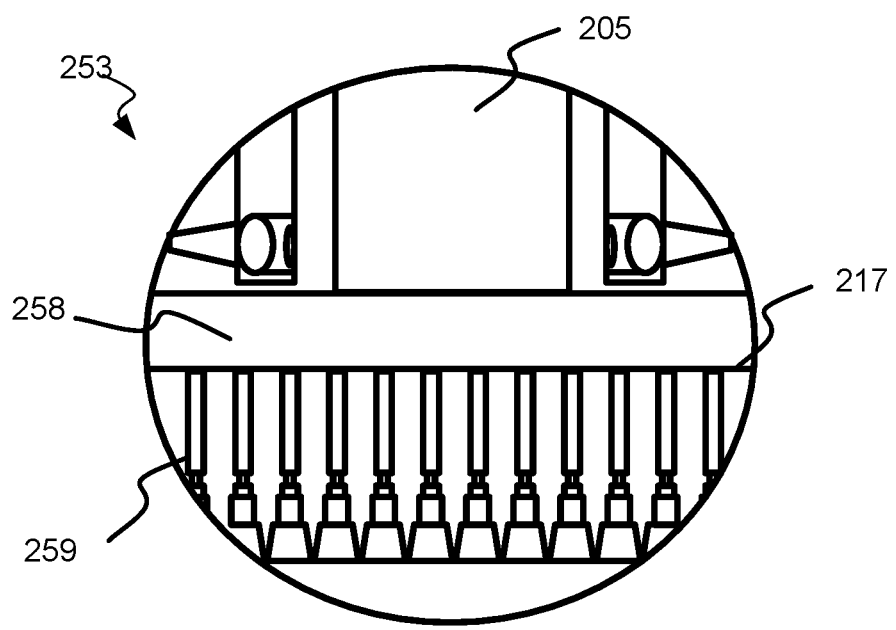
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
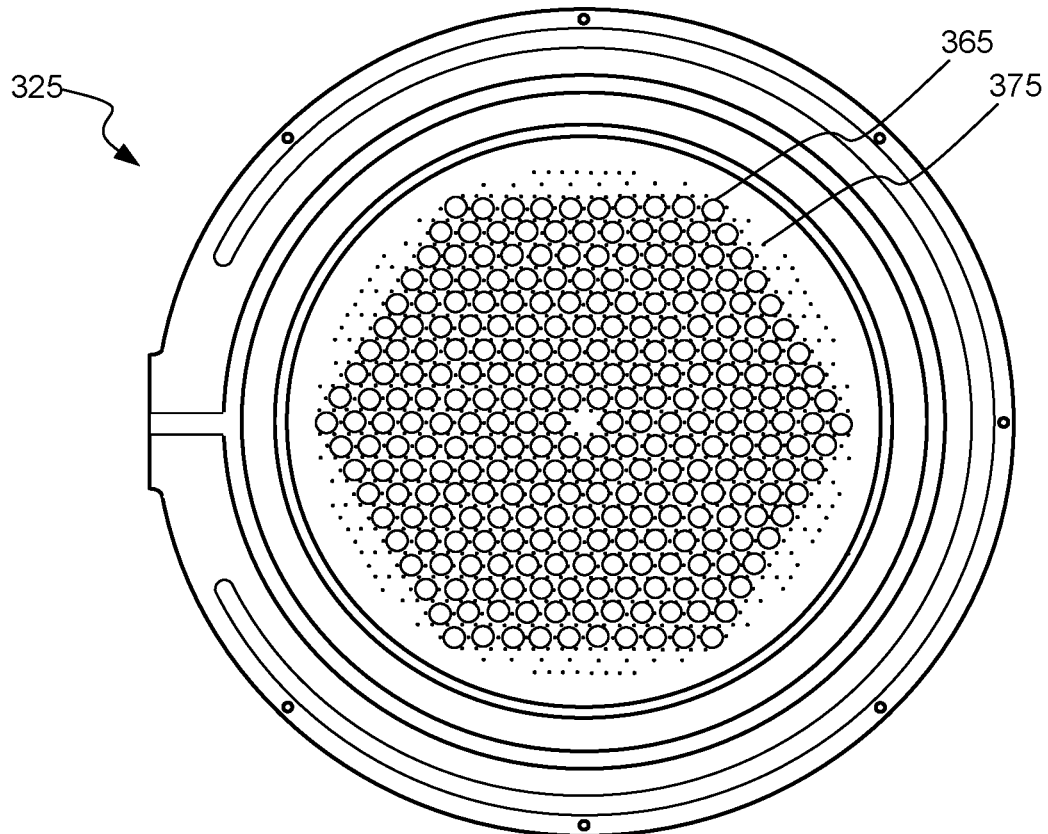
FIG. 3 shows a bottom plan view of an exemplary showerhead according to some embodiments of the present technology.

The gas distribution assemblies such as showerhead 225 for use in the processing system 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
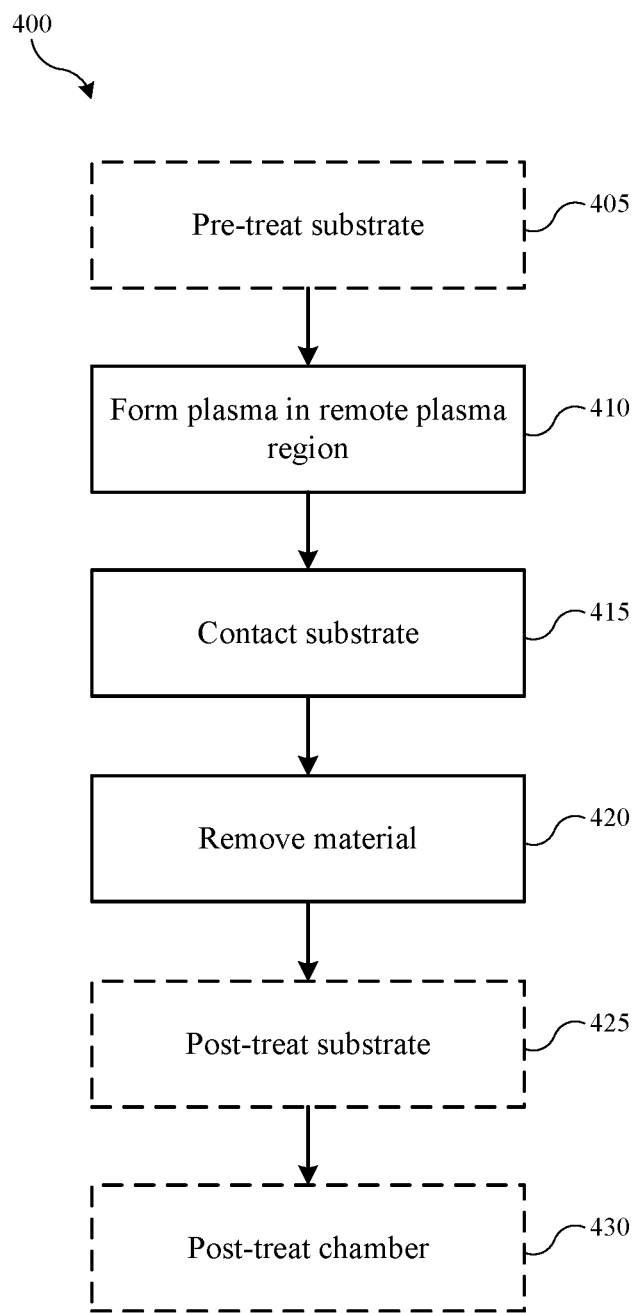
FIG. 4 shows exemplary operations in a method according to some embodiments of the present technology.
Figure 5A:
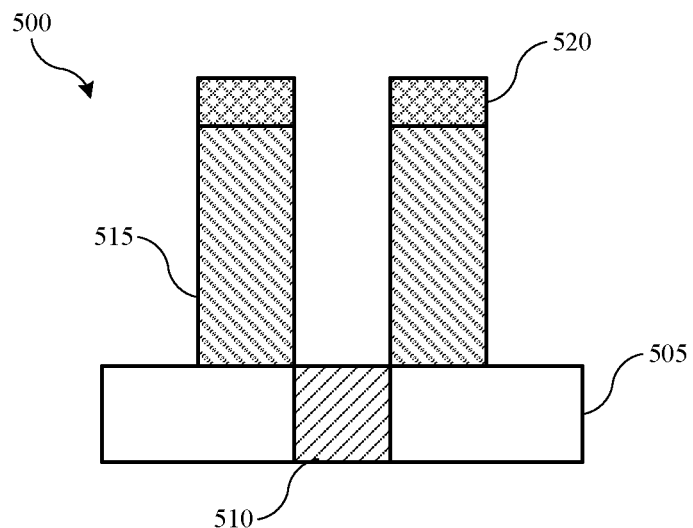
FIGS. 5A-5B show cross-sectional views of substrates being processed according to embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, gate formation, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as would be readily appreciated. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Method 400 may or may not involve optional operations to develop the semiconductor structure to a particular fabrication operation. It is to be understood that method 400 may be performed on any number of semiconductor structures, including exemplary structures on which a metal materials removal operation may be performed. Exemplary semiconductor structures may include a trench, via, or other recessed features that may include one or more exposed materials, as illustrated in exemplary structure 500 shown in FIG. 5A. The structure may include a substrate 505 on which one or more materials may be located. For example, an exemplary substrate 505 may contain silicon or some other semiconductor substrate material as well as interlayer dielectric materials through which a recess, trench, via, or isolation structure may be formed, and may include one or more overlying materials as well. Exposed materials may be or include metal materials such as for a gate, a dielectric material, a contact material, a transistor material, or any other material that may be used in semiconductor processes. In some embodiments exemplary substrates may include a metal 510 within a trench formed through overlying material 515. Metal 510 may be or include tungsten, cobalt, copper, or some other material or metal within the substrate. Overlying material 515 may be or include dielectric materials, including interlayer dielectrics, which may be or include a silicon-containing material such as silicon oxide, silicon oxycarbide, silicon oxycarbonitride, and silicon carbon nitride. In some embodiments, the material may be a silicon oxide characterized by a dielectric constant of greater than or about 3.0, or up to or about 4.0, which may improve selectivity of the etch process relative to the silicon oxide. Additionally, a titanium or tantalum material 520 may be included on the overlying material 515, and may be the target for removal. The material may be, for example, titanium oxide, titanium nitride, tantalum oxide, tantalum nitride, or any other materials that may include titanium or tantalum. The tantalum and/or titanium material may be exposed relative to one or more other materials including metal 510 and overlying material 515, or any of a number of other semiconductor materials relative to which the tantalum and/or titanium material is to be removed.

It is to be understood that the noted structure is not intended to be limiting, and any of a variety of other semiconductor structures including tantalum and/or titanium materials are similarly encompassed. Other exemplary structures may include two-dimensional and three-dimensional structures common in semiconductor manufacturing, and within or on which a titanium-containing material and/or a tantalum-containing material is to be removed relative to one or more other materials, as the present technology may selectively remove tantalum or titanium materials relative to any number of other materials, including each material noted above. Additionally, although a high-aspect-ratio structure may benefit from the present technology, the technology may be equally applicable to lower aspect ratios and any other structures.

For example, layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer may be characterized by a reduced width or thickness less than or about 100 nm, less than or about 80 nm, less than or about 60 nm, less than or about 50 nm, less than or about 40 nm, less than or about 30 nm, less than or about 20 nm, less than or about 10 nm, less than or about 5 nm, less than or about 1 nm, or less, including any fraction of any of the stated numbers, such as 20.5 nm, 1.5 nm, etc. This combination of high aspect ratios and minimal thicknesses may frustrate many conventional etching operations, or require substantially longer etch times to remove a layer, along a vertical or horizontal distance through a confined width. Moreover, damage to or removal of other exposed layers may occur with conventional technologies as well.

Method 400 may be performed to remove an exposed tantalum or titanium-containing material in embodiments, although any number of materials may be removed in any number of structures in embodiments of the present technology. The methods may include specific operations for the removal of titanium and tantalum materials, and may include one or more optional operations to prepare or treat the materials to be etched or maintained. For example, an exemplary substrate structure may have previous processing residues on a film to be removed, such as titanium or tantalum materials. For example, residual photoresist or byproducts from previous processing may reside on the titanium or tantalum layer. These materials may prevent access to the material to be removed, or may interact with etchants differently than a clean surface, which may frustrate one or more aspects of the etching. Accordingly, in some embodiments an optional pre-treatment of the titanium or tantalum material film or material may occur at optional operation 405. Exemplary pre-treatment operations may include a thermal treatment, wet treatment, or plasma treatment, for example, which may be performed in chamber 200 as well as any number of chambers that may be included on system 100 described above.

In one exemplary plasma treatment, a remote or local plasma may be developed from a precursor intended to interact with residues in one or more ways. For example, utilizing chambers such as that shown with processing system 200 described above, either a remote or local plasma may be produced from one or more precursors. For example, an oxygen-containing precursor, a hydrogen-containing precursor, a nitrogen-containing precursor, a helium-containing precursor, and/or some other precursor may be flowed into a remote plasma region or into the processing region, where a plasma may be struck. The plasma effluents may be flowed to the substrate, and may contact the residue material, such as a carbon material or other mask or resist material residue. The plasma process may be either physical or chemical depending on the material to be removed to expose the titanium or tantalum material. For example, plasma effluents may be flowed to contact and physically remove the residue, such as by a sputtering operation, or the precursors may be flowed to interact with the residues to produce volatile byproducts that may be removed from the chamber.

Exemplary precursors used in the pre-treatment may be or include hydrogen, a hydrocarbon, water vapor, an alcohol, hydrogen peroxide, or other materials that may include hydrogen as would be understood by the skilled artisan. Exemplary oxygen-containing precursors may include molecular oxygen, ozone, nitrous oxide, nitric oxide, or other oxygen-containing materials. Nitrogen gas may also be used, or a combination precursor having one or more of hydrogen, oxygen, and/or nitrogen may be utilized to remove particular residues. In some embodiments the precursors may not include diatomic oxygen, which may be more likely to oxidize the exposed metal. Once the residue or byproducts have been removed, a clean titanium or tantalum surface may be exposed for etching.

Figure 5B:
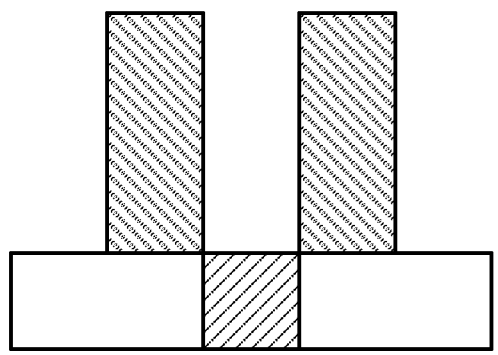

Method 400 may include flowing a fluorine-containing precursor and a hydrogen-containing precursor into a remote plasma region of the semiconductor processing chamber at operation 410. The remote plasma region may be fluidly coupled with the processing region, although it may be physically partitioned to limit plasma at the substrate level, which may damage exposed structures or materials on the structure 500. In some embodiments, the remote plasma region may include a remote plasma system ("RPS") unit fluidly coupled with an inlet to the semiconductor processing chamber, such as the RPS 201 discussed above. In some embodiments, the remote plasma region may include a capacitively-coupled plasma ("CCP") region, such as the first plasma region 215 formed by capacitively coupling the faceplate 217 and the showerhead 225 and/or ion suppressor 223, and the CCP region may be physically separated from the processing region by one of its electrodes, such as the showerhead 225 and/or ion suppressor 223. Method 400 may further include forming a plasma of the fluorine-containing precursor and the hydrogen-containing precursor to produce plasma effluents, and flowing the plasma effluents into the processing region to contact the substrate at operation 415. At operation 420, the titanium or tantalum material 520 may be removed from the substrate, as illustrated in FIG. 5B. The titanium or tantalum material may be removed selective to the substrate, metal 510, as well as overlying material 515 in embodiments.

By utilizing particular process conditions, a plasma removal may be performed as a dry etch with enhanced selectivity. Accordingly, techniques according to aspects of the present technology may be performed to remove tantalum and titanium materials from narrow features, as well as high aspect ratio features, and thin dimensions that may otherwise be unsuitable for wet etching, or other plasma etching where other exposed materials may be damaged. An optional operation may be performed to clear the substrate or chamber of residues and may include a post-treatment at optional operation 425. The post-treatment may include similar operations as the pre-treatment, and may include any of the precursors or operations discussed above for the pre-treatment. The post-treatment may clear residual fluorine from the substrate or chamber in some embodiments, and may include a hydrogen plasma.

In some embodiments an additional post-treatment may be performed to further remove residual titanium or tantalum materials from the processing chamber, such as from chamber walls or chamber components, at optional operation 430. For example, once the previous operations have been completed, in some embodiments the substrate may be removed from the processing chamber. With the substrate removed, a plasma, which may be formed remotely, may be generated from chlorine-containing precursor, which may allow an interaction with residual titanium or tantalum fluorinated materials. As one non-limiting example, boron trichloride may be used, which may beneficially dissociate to produce multiple volatile materials. Continuing the example, which is not intended to limit the technology and understanding the same may occur with tantalum, for a titanium etch process, effluent materials may include titanium tetrafluoride. During the process, some of this material may deposit on chamber sidewalls. By forming the chlorine-containing plasma, two volatile byproducts may be developed that are more volatile than the tetrafluoride. For example, the chlorine may be donated to the titanium or tantalum, while the boron accepts the fluorine. Both titanium tetrachloride and boron trifluoride may be more volatile products, and both may be exhausted from the chamber. Additionally, at sufficient processing temperatures, including any temperature discussed above, the process may be performed without striking a plasma, and instead may include flowing the treatment precursor into the processing region where a thermal reaction may be performed.

The fluorine-containing precursor may include at least one precursor selected from the group of atomic fluorine, diatomic fluorine, nitrogen trifluoride, carbon tetrafluoride, hydrogen fluoride, xenon difluoride, and various other fluorine-containing precursors used or useful in semiconductor processing. An exemplary fluorine-containing precursor used in method 600 may include nitrogen trifluoride ($NF_3$). Other sources of fluorine may be used in conjunction with or as replacements for the nitrogen trifluoride. The hydrogen-containing precursor may include hydrogen, a hydrocarbon, water, hydrogen peroxide, or other materials that may include hydrogen, although in some embodiments the precursors used in the etching operations may be oxygen-free. The precursors may also include any number of carrier gases, which may include nitrogen, helium, argon, or other noble, inert, or useful precursors.

As a non-limiting example, while nitrogen trifluoride may readily dissociate in plasma and etch a number of materials including any of the exposed materials, by incorporating the hydrogen-containing precursor in some embodiments, under processing conditions, an etch mechanism may be adjusted. For example, in some embodiments the titanium or tantalum material may be an oxide or nitride of titanium or tantalum, which may etch with nitrogen tri-fluoride. For example, the fluorine may interact with the titanium or tantalum and produce volatile titanium or tantalum byproducts, and the residual nitrogen or oxygen may be outgassed. In many processes, a similar process may occur for silicon-containing materials, or metals as noted above. However, the present technology may suppress etching of these materials with the incorporation of the hydrogen-containing precursor.

Without being bound by any particular theory, when increased hydrogen concentration is included in the plasma effluents, the hydrogen may interact with silicon and metal materials more than the titanium or tantalum materials, and may terminate the surfaces of these materials. For example, hydrogen may bond into a silicon nitride, as one non-limiting example, and may form a hydrogen-saturated film. Similarly, any of the previously noted metals, such as tungsten, for example, may have surface bond termination when exposed to an effective amount of hydrogen radical. This effect may limit or prevent fluorine penetration into the material structure, which may limit or prevent etching of the material, which may not occur with the titanium or tantalum materials, which may not have the same interaction with excess hydrogen.

Put another way, in some embodiments the hydrogen may suppress silicon and metal etching, while maintaining the titanium and/or tantalum etch. This may then increase the selectivity of etching the titanium or tantalum materials relative to any other exposed materials. Hence, in some embodiments, a flow rate ratio of the hydrogen precursor to the fluorine precursor may be maintained at greater than or about 1.0:1, and may be maintained at greater than or about 1.5:1, greater than or about 2.0:1, greater than or about 2.5:1, greater than or about 3.0:1, greater than or about 3.5:1, greater than or about 4.0:1, greater than or about 4.5:1, greater than or about 5.0:1, greater than or about 10:1, or more.

Processing conditions may impact and facilitate etching according to the present technology. For example, in some embodiments the etching plasma may be generated at lower plasma power, which may lower fluorine dissociation, and control etch rates. In some embodiments the plasma may be generated at a plasma power of less than or about 1,000 W, and may be generated at a power of less than or about 900 W, less than or about 800 W, less than or about 700 W, less than or about 600 W, less than or about 500 W, less than or about 400 W, less than or about 300 W, less than or about 200 W, or less. Additionally, as processing temperature increases above or about 200° C., etching rate of the titanium or tantalum material may improve relative to the passivated materials, which may indicate dissociation of the precursor, and/or activation of the reaction with titanium or tantalum materials. As temperature continues to increase, dissociation may be further facilitated as may the reaction with titanium or tantalum materials.

Accordingly, in some embodiments of the present technology, etching methods may be performed at substrate, pedestal, and/or chamber temperatures above or about 150° C., and may be performed at temperatures above or about 250° C., above or about 250° C., above or about 300° C., above or about 350° C., above or about 400° C., above or about 450° C., above or about 500° C., or higher. The temperature may also be maintained at any temperature within these ranges, within smaller ranges encompassed by these ranges, or between any of these ranges. In some embodiments the method may be performed on substrates that may have a number of produced features, which may produce a thermal budget. Accordingly, in some embodiments, the methods may be performed at temperatures below or about 800° C., and may be performed at temperatures below or about 750° C., below or about 700° C., below or about 650° C., below or about 600° C., below or about 550° C., below or about 500° C., or lower.

The pressure within the chamber may also affect the operations performed as well as affect at what temperature the halogen may dissociate from the transition metal. Accordingly, in some embodiments the pressure may be maintained below about 50 Torr, below or about 40 Torr, below or about 30 Torr, below or about 25 Torr, below or about 20 Torr, below or about 15 Torr, below or about 10 Torr, below or about 9 Torr, below or about 8 Torr, below or about 7 Torr, below or about 6 Torr, below or about 5 Torr, below or about 4 Torr, below or about 3 Torr, below or about 2 Torr, below or about 1 Torr, below or about 0.1 Torr, or less. The pressure may also be maintained at any pressure within these ranges, within smaller ranges encompassed by these ranges, or between any of these ranges. In some embodiments the processing pressure may be maintained between about 1 Torr and about 10 Torr, which may facilitate an initiation of the etch and may facilitate etching of the titanium or tantalum materials. Additionally, as pressure continues to increase, etching may improve up to a point before beginning to reduce, and eventually cease as pressure continues to increase, where interactions with the titanium or tantalum material surface may be suppressed as pressure continues to increase, or byproduct fluoride may be reintroduced to the film being etched, further limiting removal. Accordingly, in some embodiments, pressure within the processing chamber may be maintained below or about 10 Torr in some embodiments.

Adding further control to the etch process, the fluorine-containing precursor may be pulsed in some embodiments, and may be delivered throughout the etch process either continually or in a series of pulses, which may be consistent or varying over time. The pulsed delivery may be characterized by a first period of time during which the fluorine-containing precursor is flowed, and a second period of time during which the fluorine-containing precursor is paused or halted. The time periods for any pulsing operation may be similar or different from one another with either time period being longer. In embodiments either period of time or a continuous flow of precursor may be performed for a time period greater than or about 1 second, and may be greater than or about 2 seconds, greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 11 seconds, greater than or about 12 seconds, greater than or about 13 seconds, greater than or about 14 seconds, greater than or about 15 seconds, greater than or about 20 seconds, greater than or about 30 seconds, greater than or about 45 seconds, greater than or about 60 seconds, or longer. The times may also be any smaller range encompassed by any of these ranges. In some embodiments as delivery of the precursor occurs for longer periods of time, etch rate may increase. During these pulses, the hydrogen precursor may be continuously flowed in some embodiments.

By performing operations according to embodiments of the present technology, titanium-containing materials and/or tantalum-containing materials may be etched selectively relative to other materials, including any of the materials previously described. For example, the present technology may selectively etch titanium or tantalum materials relative to exposed regions of metals, including tungsten, cobalt, or copper, or dielectrics including silicon-containing materials as previously noted. Embodiments of the present technology may etch titanium-containing materials and/or tantalum containing materials relative to any of the metals or silicon-containing materials at a rate of at least about 20:1, and may etch titanium or tantalum materials relative to other exposed materials noted at a selectivity greater than or about 25:1, greater than or about 30:1, greater than or about 50:1, greater than or about 100:1, greater than or about 150:1, greater than or about 200:1, greater than or about 250:1, greater than or about 300:1, greater than or about 350:1, greater than or about 400:1, greater than or about 450:1, greater than or about 500:1, or more. For example, etching performed according to some embodiments of the present technology may etch titanium and/or tantalum materials while substantially or essentially maintaining any or the metals or silicon-containing materials described above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
    flowing a fluorine-containing precursor and a hydrogen-containing precursor into a remote plasma region of a semiconductor processing chamber;
    forming a plasma of the fluorine-containing precursor and the hydrogen-containing precursor to produce plasma effluents;
    flowing the plasma effluents into a substrate processing region housing a substrate, wherein the substrate comprises an exposed region of a tantalum or titanium material and an exposed region of a silicon-containing material;
    contacting the substrate with the plasma effluents; and
    removing the tantalum or titanium material selectively to the silicon-containing material, wherein the tantalum or titanium material is removed at a rate of at least 20:1 relative to the silicon-containing material, and wherein the etching method is performed at greater than 500° C.

2. The etching method of claim 1, wherein the tantalum or titanium material comprises tantalum or titanium metal or an oxide or nitride of tantalum or titanium.

3. The etching method of claim 1, wherein the substrate further comprises an exposed region of a metal comprising tungsten, cobalt, or copper.

4. The etching method of claim 1, wherein a plasma power is maintained at less than or about 1,000 W.

5. The etching method of claim 1, wherein the etching method is performed at less than or about 800° C.

6. The etching method of claim 1, wherein the etching method is performed at a pressure less than or about 10 Torr.

7. The etching method of claim 1, further comprising:
    a pre-treatment performed prior to flowing the fluorine-containing precursor, wherein the pre-treatment comprises contacting the substrate with a plasma comprising one or more of oxygen, hydrogen, water vapor, or nitrogen.

8. The etching method of claim 1, further comprising:
    a post-treatment performed subsequent the etching method, wherein the post-treatment comprises contacting the substrate with a plasma comprising one or more of hydrogen, nitrogen, oxygen, or water vapor.

9. The etching method of claim 1, further comprising:
    removing the substrate from the semiconductor processing chamber, and
    removing a residue from chamber walls of the semiconductor processing chamber.

10. The etching method of claim 9, wherein removing the residue comprises:
    providing a chlorine-containing precursor or plasma effluent or a bromine-containing precursor or plasma effluent.

11. An etching method comprising:
    forming a plasma of a treatment precursor comprising one or more of oxygen, hydrogen, or nitrogen to produce treatment plasma effluents;
    flowing the treatment plasma effluents into a substrate processing region of a semiconductor processing chamber;
    contacting a substrate housed in the substrate processing region with the treatment plasma effluents, wherein the substrate defines an exposed region of a tantalum or titanium material and an exposed region of a tungsten, cobalt, or copper;
    removing a carbon-containing material from a surface of the tantalum or titanium material;
    forming a plasma of a fluorine-containing precursor and a hydrogen-containing precursor;
    contacting the substrate with plasma effluents;
    removing the tantalum or titanium material; and
    subsequent to removing the tantalum or titanium material and prior to removing the substrate from the semiconductor processing chamber, contacting the substrate with a plasma comprising hydrogen.

12. The etching method of claim 11, wherein a plasma power during the forming of the plasma of the fluorine-containing precursor is maintained at less than or about 1,000 W.

13. The etching method of claim 11, wherein the etching method is performed at greater than or about 300° C.

14. The etching method of claim 11, wherein the etching method is performed at a pressure less than or about 10 Torr.

15. The etching method of claim 11, further comprising:
    removing the substrate from the semiconductor processing chamber, and removing a residue from chamber walls of the semiconductor processing chamber.

16. An etching method comprising:
    flowing a fluorine-containing precursor and a hydrogen-containing precursor into a remote plasma region of a semiconductor processing chamber;
    forming a plasma of the fluorine-containing precursor and the hydrogen-containing precursor to produce plasma effluents;
    flowing the plasma effluents into a substrate processing region housing a substrate, wherein the substrate comprises an exposed region of a tantalum or titanium material and an exposed region of a silicon-containing material;
    contacting the substrate with the plasma effluents;
    removing the tantalum or titanium material selectively to the silicon-containing material;
    forming a plasma of a treatment precursor comprising hydrogen to produce treatment plasma effluents; and
    contacting the substrate with the treatment plasma effluents, wherein the etching method is performed at a temperature greater than 500° C.

17. The etching method of claim 16, wherein the treatment plasma effluents are configured to remove residual fluorine from one or more of the substrate or the semiconductor processing chamber.

18. The etching method of claim 16, further comprising:
removing the substrate from the semiconductor processing chamber, and
removing a residue from chamber walls of the semiconductor processing chamber with a chlorine-containing precursor.

19. The etching method of claim 16, wherein the tantalum or titanium material is removed at a rate of at least 20:1 relative to the silicon-containing material.

20. The etching method of claim 16, wherein the etching method is performed at a temperature less than or about 800° C.

* * * * *